United States Patent [19]

Strobel

[11] Patent Number: 4,610,756
[45] Date of Patent: Sep. 9, 1986

[54] PRINTED CIRCUIT BOARD AND PROCESS FOR ITS MANUFACTURE

[75] Inventor: Jean-Paul Strobel, Avully, Switzerland

[73] Assignee: Cirtech S.A., Switzerland

[21] Appl. No.: 513,337

[22] Filed: Jul. 13, 1983

[30] Foreign Application Priority Data

Jul. 16, 1982 [CH] Switzerland .................. 4352/82

[51] Int. Cl.$^4$ .................. C23F 1/02; B44C 1/22; C03C 15/00; C03C 25/06
[52] U.S. Cl. .................. 156/645; 156/656; 156/659.1; 156/661.1; 156/666; 156/902; 29/852; 174/68.5; 427/97; 430/313; 430/318
[58] Field of Search .................. 174/68.5; 156/644, 645, 156/656, 659.1, 661.1, 666, 901, 902; 29/852; 427/97; 430/313, 318; 204/15, 24

[56] References Cited

U.S. PATENT DOCUMENTS 3,702,284 11/1972 Merkenschlager .................. 204/15
3,772,101 11/1973 Chumbres .................. 156/656
4,179,800 12/1979 Takaba et al. .................. 156/656

FOREIGN PATENT DOCUMENTS 1811377 6/1970 Fed. Rep. of Germany .

OTHER PUBLICATIONS

IBM Technical Disclosure Bulletin, vol. 13, No. 1, Jun. 1970, New York, NY, R. H. Mead: "Landless plated through-hole process", p. 181.

Primary Examiner—William A. Powell
Attorney, Agent, or Firm—Ostrolenk, Faber, Gerb & Soffen

[57] ABSTRACT

The printed circuit board is produced without soldering lands around the contacting, supporting or interconnecting holes of a simple faced, double-faced or multilayer circuit.

The inner wall of the hole is covered with a copper layer which extends only until the free surface of the naked board, i.e. levels that surface, or does not fully extend until this level. The said layer is covered with a tin-lead metallisation layer which serves as a soldering link element. The solder mounts towards the wire or pin of the soldered component but does not touch nor spoil the free, insulating surface of the support.

One necessary condition of the making process of the board is the precise, clean, proper and sharp drilling of the holes.

11 Claims, 4 Drawing Figures

PRINTED CIRCUIT BOARD AND PROCESS FOR ITS MANUFACTURE

BACKGROUND OF THE INVENTION

1. Field of the Invention

The present invention generally relates to printed circuit boards and to processes for making printed circuit boards. More specifically, the invention is related to printed circuit boards comprising conductor paths on an insulating substrate as well as plated through holes being in contact with at least one or none of said conductor paths, as well as to a complete process for making such special circuit boards.

2. Description of the Prior Art

Printed circuits such as described are well known in the fields of electricity and electronics, serving as basic elements in the realisation of electric and electronic circuits and devices for all uses. The flat substrate of insulating material serves simultaneously as a mounting support for the circuit components like resistors, capacitors, semiconductors and integrated circuits, and by the conductor paths which it bears, as connecting means between these components.

The substrate may be a plate made of insulating material such as bakelite, epoxy resin, glass fiber reinforced resins, polyester etc., having a thickness of about 0.1 to 6 mm, for example; it may also be constituted by a more or less thin sheet of soft, elastic or halfrigid insulating plastics material. The conductor paths consist generally of copper or copper alloys and may be tin, tin alloy, silver or gold plated.

The manufacture of printed circuits is likewise known in principle. Generally spoken, one provides a copper clad board wherein the copper layers may be on one or both faces of the board and may have a thickness of, for example, 5 to 100 microns each, other thicknesses being easily applicable for special cases. The copper surface (or surfaces) is then covered by a suitable design which corresponds to the desired connections between the components to be placed. The copper is then removed from all sites where it is not desired, according to said design or pattern, by an technique etching wherein the copper is oxidized and dissolved as a simple or a complex salt. Known etching reagents are, for example, aqueous solutions of iron (III)-chloride or ammonium perchlorate, or persulfate.

Generally, the through holes necessary for the mounting of the components or, as the case may be, for the interconnection between the surface printed circuits, can be drilled at any stage whatsoever of the overall process. These holes are metallized on their walls in order to assure the conductive interconnection between the surface printed circuits or in order to improve the contact surface for the subsequent soldering of components. The metallisation of the hole walls has already been known and can be accomplished by metallization processes well known in the art, for example by electroless plating with optional further galvanic plating.

Landless plated through holes and a process for making same have already been disclosed in U.S. Pat. No. 3,772,101 by L. G. Chumbers and G. J. Rudy, patented from Nov. 13, 1973. This patent describes a method for producing landless plated through holes in printed circuit boards, and the process is conducted in such a manner that the diameter of the holes in the mask used for protecting the copper layer from being etched, is the same as the diameter of the hole in the board. This requirement causes mask registration problems, and there is, as a result, an overhang of plated material on the surface of the finally obtained circuit around its holes. In another embodiment, the drilled board itself is used as a photomask which requires, however, the use of a positive tenting photoresist. This requirement has drawbacks since it will create confusion problems in practice. Furthermore, as the drilled circuit itself is used as a mask, irradiation must be effected from both sides, and the process of reproducing the circuit path pattern must be split up into two masking and four irradiation steps. The making of landless connection holes for components is not disclosed.

Until now, it has generally been considered as necessary that each connection hole must be surrounded by a solderable metallic land in order to guarantee a reliable solder connection between the conductor path and the connecting wire of a component like the integrated circuit pin. This metallic land is normally a preferably tinned "eye"; the metallic surroundings of the hole can also be constituted by the conductor path itself should its width be greater than the hole diameter. The necessity of having a soldering eye around the connecting holes has been based, until now, on defects of the metallic connection between the conductor path and the metallisation of the hole; only an eye or a land was deemed to give the necessary perfect contact. Furthermore, the land was to ascertain a sufficiently great soldering surface in order to keep the component strongly at its place and to guarantee an appropriate electric contact.

The development of electronics toward miniaturizing requires an increasing density of conductor paths and components on circuit boards. The growing integration tends to fewer external components but to more conductor paths and integrated circuits, and it is more and more necessary to use all the space disposible on circuit boards. For example, current technique allows to pass one or two paths between two adjacent land containing connection holes for integrated circuits. The holes which have a diameter of, e.g., 0.8 mm, are distant by the modular pin distance of 0.1 inch or 2.54 mm which leaves a disposible space of about 1.1 mm between the lands of adjacent holes if the lands have a width of not more than 0.3 mm. These values are the optimum of what can be obtained with the current up-to-date technique.

German Offenlegungsschrift No. 1 811 377, laid open on June 18, 1970, alleges as an advantage the possibility to use landless plated through holes as connection holes but does not disclose such a use.

Furthermore, it has been proposed to use so-called multilayer circuits in order to increase the density of printed circuits. This technique comprises the combination of a plurality, at least two, of individual double-layer circuits etched beforehand, by the use of thin isulating sheets pre-impregnated with polymerizable resins such as epoxy resins. These sheets are placed between two printed circuits, and the sandwich composed by two or more circuits, with the intermediate sheets, is then heated under pressure to form a block. As a final step, interconnection through-holes are drilled and their walls metallized as described. However, as this technique is very complicated because of the alignment and connection problem and of the high prices, it is not widely used.

3. Objects of the Invention

It is therefore a first and important object of this invention to provide a printed circuit board of the previously defined nature having through holes which may serve as interconnecting holes for double layer or multilayer circuits as well as in monolayer or any multilayer circuits as connecting posts for components to be soldered thereto.

Another object of the present invention is concerned with printed circuits wherein the density of the conductor paths as well as the overall part density, and the definition of the circuit, expressed as the number of conductors per unity of length has values largely exceeding the highest densities and definitions to be obtained with the techniques now used.

A further and equally significant object of the present invention is to provide a process for making circuit boards with through holes, to be used for interconnection and/or for the direct soldering of components.

Another object of this invention is a process for the preparation of such printed circuits in a particularly simple, economic and rapid manner producing for the first time easily solderable landless contact through holes having excellent electrical contact with at least one conductor path on the circuit or a component.

SUMMARY OF THE INVENTION

The printed circuit of the invention, of the kind as defined in the introduction, is a monolayer, double layer or multilayer printed circuit comprising conductor paths on at least one of its surfaces, and through holes traversing the substrate which forms the printed circuit together with the conductor paths. The said holes are in contact with at least one of the conductor paths. The width of the conductor paths is preferably inferiour to the diameter of the holes. The walls of the holes are electrically conductive. The circuit is free from lands or eyes around the holes. The conductor paths are provided with a copper layer which has preferably been deposited by galvanic plating. This copper layer covers also the walls of the holes, and the copper layer covering the interiour surface of the holes, i.e. their walls, ends on the level of the insulating circuit board substrate or below said level, around the whole circumference of the hole, normally excepted that part where the cooper layer on the walls is in contact with the conductor path. The invention also concerns through holes without any contact to a conductor path such holes are any supporting holes.

Preferably, a tin-lead soldering layer covers at least part of the copper-plated parts and sites of the circuit. Monolayer and double layer circuits are preferred, i.e. such circuits which have been copper clad on one or both sides. The hole diameter is adapted to the pin diameter of the components to be soldered. If only through holes for interconnection are desired, their diameter can still be less; for example, contact holes may have a diameter of about 0.8 mm whereas interconnecting holes may have an inner diameter of only about 0.4 mm or even 0.3 mm.

In a special embodiment, the height of that part of each hole which is free from conducting material, in other words which is ending below the level of the support surface, corresponds roughly to the thickness of the original copper clad as will be explained later.

The process for making the printed circuit of the invention comprises essentially the following stages:

(1) providing a flat and clean circuit board of insulating material, copper clad on at least one of its surfaces;

(2) drilling of the through holes according to the desired pattern. This drilling must be effected with the best possible precision. The holes should be perfectly cylindrical and in right angle to the circuit board. Furthermore, the holes should have sharp and uniform edges.

(3) metallization of at least the inner walls of the holes. This metallization may be a chemical copper plating ("copper flash"). As the same time, the whole circuit board surface might be metallized;

(4) applying a photomask on the drilled circuit board; this mask covers the material to be etched afterwards but does not cover the conductor paths to be produced, the mask having holes at the sites of the circuit through holes, the holes of the mask having a smaller diameter than the drilled holes so that the mask goes over the edges of the drilled holes and covers these edges;

(5) galvanic plating of a copper layer on at least the inner walls of the holes and the adjacent parts of the conductor paths to be formed;

(6) applying an etching protective mask, for example a tin-lead layer, to the masked circuit in order to protect those parts of the circuit board which are not to be etched, and (7) etching the circuit.

One prefers to apply the tin-lead layer from a hot melt of these metals by immersion or by wave coating.

DESCRIPTION OF THE PREFERRED EMBODIMENTS

Figure 1:
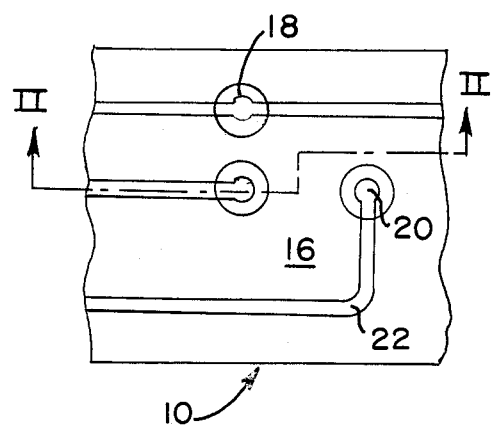
FIG. 1 is an enlarged top view of part of a copper clad circuit board under preparation.

As a first step of preparation, the starting material is to be provided, namely a circuit board copper clad on one or both surfaces. Although double clad boards and also mono or double clad thin sheets of plastics material like polyester may be used, the following description will be made, without being considered as restrictive, for sake of simplicity with reference to a circuit board copper clad only on the top surface.

The copper layers have generally a thickness of about 35 microns (0.035 mm) but may also be thinner, e.g. about 15 microns; for an extreme high resolution to be obtained by this invention only, we even recommend a copper thickness of only 5 microns.

After the usual preparation steps, namely cutting to the desired dimensions, cleaning, drying etc., the drilling of the holes is accomplished. Normally, contacting holes for the later soldering of external components like resistors, capacitors, impedances, integrated circuits, transistors, diodes etc., will have a caliber of about 0.8 mm whereas interconnecting holes (for double layer or multilayer circuits) are drilled to about 0.4 mm. This drilling is done with the aid of a drilling template or, alternatively, a numerically controlled or computerized drilling machine. However, all holes can be of the same diameter.

It is preferred to conduct drilling in such a way as to obtain a really prismatic (i.e. a perfectly cylindrical) hole, perfectly clean, neat and smooth, free from burrs, ridges and notches and with sharp edges.

The drilled boards are now metallized at least on the walls of the holes. This metallization is a so-called "chemical flash", i.e. an electroless plating process which deposites a thin but strongly adhering base metal layer on the substrate. This technique is well known in the art. Preferably, a thin copper lining of about 0.1 to 2 microns is deposited. Since it is practical not to mask the major surfaces of the board, the metallization bath will be applied on the whole board so that the produced lining will cover the whole surfaces and not only the walls of the holes.

A film type photoresist is now laminated on the top surface of the board. This photoresist is obtained by techniques well known in the art. The photoresist covers the whole board excepted those parts which must remain after etching, namely conductor paths and indications to be read like instructions, numbers etc. The holes drilled beforehand are partially covered by the photoresist in such a manner that the edges of the holes are completely covered under the photoresist with preferable overlaps the edges by about 0.1 mm for example.

The next stage is the galvanic copper plating of the board covered by the photoresist. This is an important step which ascertains the perfect contact between the holes and the conductor paths and results in the augmentation of the lining produced by the chemical flash, and this step is conducted to deposit a 20 to 30 micron plating on the walls of the holes and also simultaneously on the copper clad not covered by the photoresist.

Then, a tin-lead alloy is galvanically plated on the copper layer produced during the preceding stage. The man skilled in the art knows that these metals can simultaneously be deposited by a galvanic technique from aqueous acidic baths containing fluoborates of these metals. The weight ratio tin:lead can be influenced within certain limits, by the composition of the galvanic bath.

Figure 2:
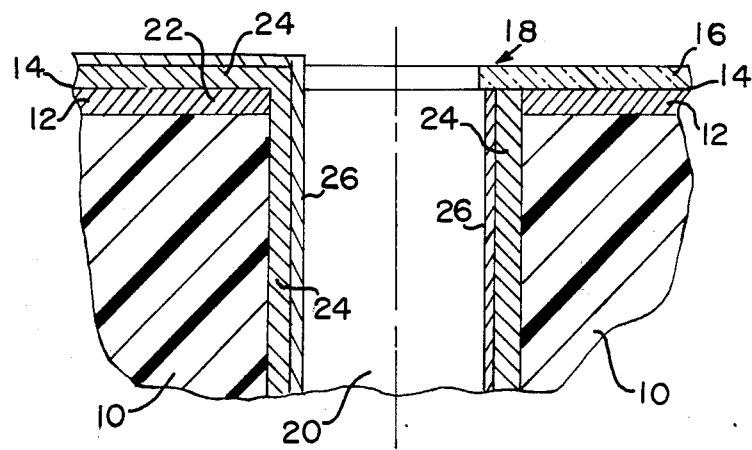
FIG. 2 is a cross sectional view of the board of FIG. 1 along the line II—II in FIG. 1.

FIGS. 1 and 2 now show how the board generally presents at this stage of the described process. The insulating board 10 which forms the substrate, carries the copper clad layer 12. All surfaces are covered by the primary metallic lining 14 produced by the chemical flash. The lining 14 is partially masked by photoresist 16 part of which 18 overhangs the edges of the holes 20 excepted where the conductor path 22 is foreseen which will be in perfect electrical contact with the walls of the holes 20. The galvanically plated copper layer 24 and the tin-lead overlayer 26, galvanically plated too, cover all the surfaces of the board excepted the surface covered by the photoresist.

Now, the photoresist 16 is removed, and the board is etched. The naked copper is dissolved, leaving those desired parts of the board which are covered by the etching resist 26. The board is preferably heated after etching to such a temperature which homogenizes the electrically produced tin-lead alloy plating and simulataneously, the porosity of the tin-lead layer is eliminated. The board is now represented by FIG. 3 in a horizontal cross sectional view. The basic copper cladding 12 has been etched away but also the upper part 28 of the galvanic copper plating on the walls of the hole 20 which had not been protected by the etching resist alloy 26. The upper annular part of the hole 20 is therefore free from copper—excepted that portion of the circumference where the surface conductor 22 is ending—, and the height of such a "free ring" is about equal to the thickness of the basic cladding 12 removed by etching. When the thickness of the surface conductors is small, and depending upon certain etching conditions, the height of said "free ring" may be small and even nearly zero, and in such cases, the layer 24 onto the hole walls may extend until the free surface of the naked board 10 when the hole is only a supporting hole, said "free ring" is a complete one.

Figure 3:
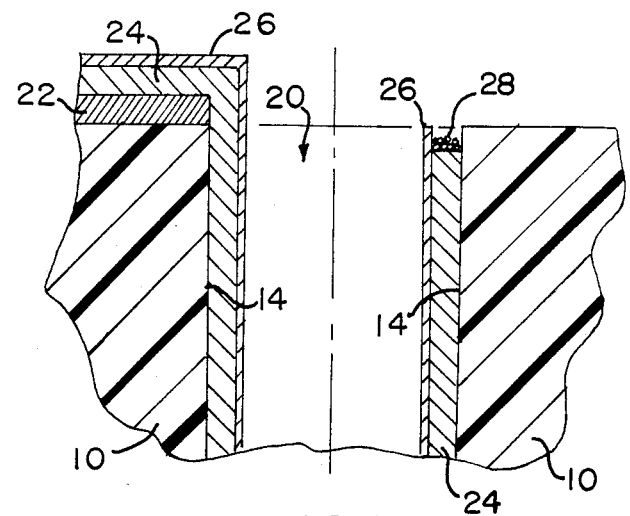
FIG. 3 is a cross sectional view similar to FIG. 2 but after the final etching.

It is possible to protect the free copper surface of the "free ring" against oxydation by a supplementary heat tinning which will cover the layer 24 with tin or a tin-lead alloy, depending upon the method used. This condition is shown in FIG. 3 (and also FIG. 4) by reference numeral 28, as far as the upper edge of the said "free ring" is concerned; the corresponding layer produced by the heat or melt tinning is not shown on the other portions of the board. This tin or tin alloy layer covers at least the inner wall of the holes.

A process stage recommended until now should be omitted, namely the brushing of the board after metallization. It has been found that such a brushing rather introduced dust and other contaminating matter instead of eliminating same. A metallized layer or plating not brushed seems to ascertain better adherence of solder than brushed boards.

The board is now ready to receive external parts and components followed by wave soldering at a temperature of about 200° C., for example.

It is evident that all process stages should be carried out under the cleanest conditions. All the aqueous baths and liquors, metal melts etc. will be kept clean and free from foreign matter and other impurities.

Figure 4:
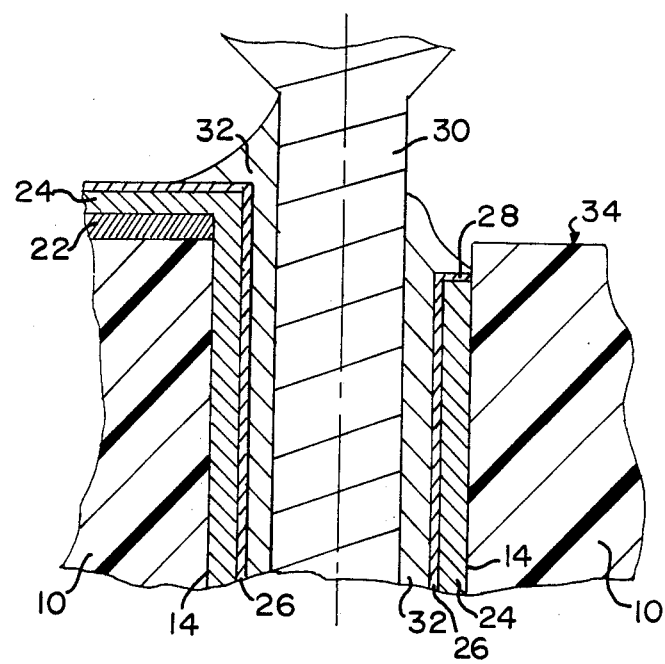
FIG. 4 is a cross-sectional view similar to FIGS. 2 and 3 after the soldering of a component, showing the result of said soldering.

Finally, FIG. 4 shows in a vertical cross-sectional view of the hole of FIGS. 2 and 3 after soldering of the pin 30 of a component. It can be seen that the solder 32 does not reach and spoil the copper-free surface 34 of the board 10. A soldering mask could be used but this is not necessary in most cases.

Generally, the diameter of the component mounting holes (the contact holes) is greater than the width of the conductor paths or at most equal to them. In other words, the conductor paths are generally made narrower than the diameter of the holes. This measure contributes to the property of the soldering, namely in order to keep the free board surface 34 free from solder.

The invention allows to obtain such a high conductor density which has by far never seen up to now. For example, it is possible to pass eight well defined paths between two adjacent holes for integrated circuits having a diameter of 0.8 mm, i.e. on a space of only 1.74 mm wide (namely 2.54–0.8 mm), without any contact between the paths themselves and the pins of the integrated circuit. It has also been possible to produce 22 parallel, adjacent distinct paths over a width of only 6 mm. These values have been considered as absolutely impossible until now.

The invention is also particularly suited for the construction of multilayer circuit boards.

Of course, the finished boards may be treated by all known finition methods like cleaning, lacquering, painting, etc.

It has been found that the landless hole of the invention—which can surprisingly be used as a soldering receiving contact and support hole for external components—is free from contact defects and corrosion problems. It is believed that this result is based upon the simultaneous galvanic copper deposit on the walls of the hole and the conductor paths, combined with the annular-shaped free space at the upper (and lower) final portion of the hole wall and its covering with solder alloy. The soldered components are solidly held in place in the same manner as if a soldering land or eye were present.

An important embodiment of the invention is the possibility of forming landless through holes also without contact with a conductor path. The purpose of this embodiment is the possibility of soldering a connecting wire or pin of a component, e.g. an integrated circuit, in order to maintain it firmly in its place or to assist in doing so. As it has already been described, a soldering of the holes of the invention gives no spoiling of the insulating surface.

What I claim is:

1. A method for making a printed circuit board by masking and etching, comprising the following steps:
   (1) providing a flat, clean circuit board consisting of insulating material and copper clad on at least one of its major surfaces,
   (2) drilling, according to a desired and predetermined pattern, perfect and precise through holes in said board,
   (3) metallization of at least the inner wall of the drilled holes, to deposit a thin metal lining,
   (4) masking of the circuit board surface or surfaces by a mask showing a predeterminated circuit pattern, the mask overlapping the edges of the drilled holes,
   (5) applying an etching resist on the so masked circuit board, and
   (6) etching the circuit.

2. The method of claim 1 wherein the etched circuit board is heat tinned from a metal melt at least on the inner walls of the holes.

3. The method of claim 1 wherein step (5) is the electroplating with a tin-lead alloy by simultaneously depositioning these metals from an aqueous solution of their salts.

4. In a method for making a printed circuit board having conductor paths on at least one major surface of a supporting substrate of electrically insulating material, and through holes traversing said substrate and having electrically conductive inner walls which are in electric contact with at least one or none of said conductor paths, comprising masking and etching steps, the improvement that the circuit board is free from soldering lands, the inner walls of the holes being augmented by an electrically plated copper layer which optionally also covers at least part of the conductor paths, the copper layer covering the hole walls ending at a location being at level or below the level of the surface plane of said substrate over the entire circumference of said inner wall of the hole except the width of the conductor path with which said copper layer is in contact if there is any conductor path to be in contact with the hole wall, said improvement being implemented by the following steps:
   (1) providing a flat, clean circuit board consisting of insulating material and copper clad on at least one of its major surfaces,
   (2) drilling, according to a desired and predetermined pattern, perfect and precise through holes in said board,
   (3) metallizing at least the inner wall of the drilled holes, to deposit a thin metal lining,
   (4) masking one surface or both surfaces of the circuit board by a mask showing a predetermined circuit pattern, the mask overlapping the edges of the drilled holes,
   (5) applying an etching resist on the so masked circuit board,
   (6) etching the circuit, and
   (7) heat tinning at least the inner walls of the holes from a molten metal.

5. The method of claim 4 wherein step (5) is carried out by electroplating with a tin-lead alloy to simultaneously deposit these metals from an aqueous solution of their salts.

6. The method of claim 4 wherein said conductor paths are less wide than the diameter of said holes.

7. The method of claim 4 wherein at least the copper layer on the inner walls of the holes and the adjacent portions of the conductor paths in contact with said layer on the hole walls, are covered by a tin-lead alloy.

8. The method of claim 4 wherein said substrate carries conductor paths on both major surfaces.

9. The method of claim 4 wherein said substrate carries conductor paths on one of its two major surfaces.

10. The method of claim 4, wherein the diameter of component mounting holes is drilled to about 0.8 mm and that of the holes interconnecting the conductor paths on opposite major surfaces of the substrate, to about 0.3 mm to 0.4 mm.

11. The method of claim 4 wherein the copper layer covering the inner wall of the hole is etched to end at a distance below the level of said substrate which corresponds to the thickness of the original conductor paths before augmentation by the plated copper layer.

* * * * *